(12) United States Patent
Lee (10) Patent No.: US 7,300,301 B2
(45) Date of Patent: Nov. 27, 2007

(54) CONDUCTOR HEAD

(75) Inventor: Michael A. Lee, Lilburn, GA (US)

(73) Assignee: The Southern Company, Atlanta, GA (US)

( * ) Notice: Subject to any disclaimer, the term of this patent is extended or adjusted under 35 U.S.C. 154(b) by 0 days.

(21) Appl. No.: 11/347,878

(22) Filed: Feb. 6, 2006

(65) Prior Publication Data

US 2006/0175054 A1    Aug. 10, 2006

Related U.S. Application Data

(60) Provisional application No. 60/650,035, filed on Feb. 4, 2005.

(51) Int. Cl.
*H01R 13/00* (2006.01)

(52) U.S. Cl. ...................... 439/477; 439/224

(58) Field of Classification Search ............... 439/224, 439/477, 479
See application file for complete search history.

(56) References Cited

U.S. PATENT DOCUMENTS

| | | |
|---|---|---|
| 1,862,073 A | 7/1932 | Woolson |
| 2,120,447 A | 6/1938 | Tipsord |
| 2,253,432 A | 8/1941 | Johnson |
| 2,304,807 A | 12/1942 | Donoghue |
| 2,453,761 A | 11/1948 | Schoonmaker |
| 3,036,286 A | 5/1962 | Gore et al. |
| 3,139,948 A | 7/1964 | Rorden |
| 3,177,459 A | 4/1965 | Toedtman |
| 3,320,524 A | 5/1967 | Miller, Jr. |
| 3,624,592 A | 11/1971 | Walter |
| 4,097,108 A | 6/1978 | Prodel |
| 4,846,725 A | 7/1989 | Williams et al. |
| 5,397,982 A * | 3/1995 | Van Lankvelt .............. 324/126 |
| 5,556,299 A * | 9/1996 | Finke .......................... 439/479 |
| 7,160,142 B2 * | 1/2007 | Hughes et al. .............. 439/479 |

* cited by examiner

*Primary Examiner*—Thanh-Tam Le
(74) *Attorney, Agent, or Firm*—Seyed Kaveh E. Rashidi-Yazd, Esq.; Troutman Sanders LLP (57) ABSTRACT

A quick-release conductor head for engaging a conductor, but capable of quickly releasing the conductor, if necessary. The quick-release conductor head includes a body for receiving the conductor, a latch pivotally connected to the body, a locking system for temporarily maintaining the latch in a closed position, and an opening system for automatically moving the latch from the closed position to the open position. In the closed position, the conductor is maintained within the body, while in the open position the body can be easily disengaged from the conductor. The present invention can include a guide system adapted to guide the conductor towards the body and guide the latch towards the locking system, when the latch is moved towards the closed position. The opening system can include a triggering mechanism and a bias adapted to disengage the latch from the locking system and move the latch towards the open position.

16 Claims, 5 Drawing Sheets

CONDUCTOR HEAD

CROSS-REFERENCE TO A RELATED APPLICATION

This application claims the benefit of U.S. Provisional Application 60/650,035, filed on Feb. 4, 2005, the entirety of which is incorporated herein by reference.

BACKGROUND OF THE INVENTION

1. Field of the Invention

The present invention relates, in general, to a quick-release latch that is fitted into a conductor head that can be operated from the ground, the conductor head having a triggering mechanism.

2. Description of the Related Art

In the power industry, a conductor head is generally used to position and control a conductor, such as a power line, when a utility worker is performing overhead conductor work. The conductor head can be attached to a small fiberglass arm or jib mounted on the end of an upper boom utilized in most utility bucket trucks. A serviceperson performing work from within the bucket of the utility truck does not typically have the strength to handle heavy conductors. Accordingly, the serviceperson can extend the jib arm towards the conductor, such that the conductor head receives the conductor. The conductor head includes a latch that is closed once the conductor is received, thereby preventing the conductor from accidentally slipping from the conductor head during service. Effectively, the conductor is locked within the body of the conductor head once the latch is closed.

If, however, an unfortunate event occurs that incapacitates the serviceperson in the bucket (e.g., a heart attack, electrocution, or being knocked unconscious) there does not exist an easy solution for unlatching the conductor head from the conductor in order to lower the bucket towards the ground and rescue the serviceperson. Attempting to lower the bucket of the utility truck while the conductor head is still connected to the conductor can cause extensive damage to the utility truck and the conductor. Further, such an attempt could cause dangerous conditions if the conductor is badly damaged. A second utility bucket truck is not always available, but even if available the use of a second utility bucket truck requires a waste of valuable resources.

To address this problem, a latch extension has been added to the conductor head, thereby providing a protrusion positioned on the latch. If the latch extension can be accessed from the ground, a second serviceperson can unlatch the conductor head from the conductor. Although suitable for its attended purpose, the latch extension is not always easily accessible by a serviceperson located on the ground. The latch extension also requires the difficult process of trying to hook the protrusion from the ground using an extended pole or other similar device. Further, the latch extension is often difficult to use by a serviceperson in the bucket, because the serviceperson is generally wearing thick rubber gloves.

Other related art in this field includes the following:

| PATENT NO. | INVENTOR(S) | ISSUE DATE |
| --- | --- | --- |
| 1,862,073 | Woolson | 7 Jun. 1932 |
| 2,120,447 | Tipsord | 14 Jun. 1938 |
| 2,253,432 | Johnson | 19 Aug. 1941 |
| 2,304,807 | Donoghue | 15 Dec. 1942 |
| 2,453,761 | Schoonmaker | 16 Nov. 1948 |
| 3,036,286 | Gore et al. | 22 May 1962 |
| 3,139,948 | Rorden | 7 Jul. 1964 |
| 3,177,459 | Toedtman | 6 Apr. 1965 |
| 3,320,524 | Miller, Jr. | 16 May 1967 |
| 3,624,592 | Walter | 30 Nov. 1971 |
| 4,097,108 | Prodel | 27 Jun. 1978 |
| 4,846,725 | Williams et al. | 11 Jul. 1989 |

U.S. Pat. Nos. 3,139,948 and 3,320,524 show the environment in which a spring-biased hot wire conductor head is utilized, while the remaining patents all appear to show wire heads wherein the same can be removed by releasing the spring.

The conventional devices do not incorporate a quick release mechanism, but are simply manual. Herein the term "manual" means that the device has a threaded clamp in it, and a serviceperson has to insert a hot line stick of some sort into a ring in the bottom, and must turn it and work the thread by hand from the ground or from the pole or from a utility bucket truck, but it does not attach to a utility bucket truck.

In more specific detail, U.S. Pat. No. 1,862,073 discloses a device that is simply a grounding plant (i.e., it is an old device that is no longer used), but it was devised to make an electrical connection to an electrical conductor in order to ground it. It is designed to go from a phase to a common mutual and actually ground the conductor so a worker could work on it. The device does have some spring tension, which keeps it closed, but it is not designed to move or hold any kind of appreciable load. The device is strictly a means of clamping a ground from the pole as could be utilized in the 1930s, as there were no utility bucket trucks in use back then. The device included a wood handle on an end, and this wood would be dried and varnished and used as a hot stick tool. The spring is intended to keep the device closed, thereby keeping tension on the grounding clamp with the conductor. The spring, however, is not used as a quick-release to open the device.

U.S. Pat. No. 2,120,447 discloses a wire clamping device, having some of the characteristics of clamps used today by utility companies, but the device is attached to a conductor as a connector for conducting. Moreover, the device connects one conductor to another on a temporary basis. The device does not possess the design integrity or capabilities for lifting or holding any weight, or any kind of automatic opening device, as one has to turn a thread and screw to open and close it. The device is a manual clamp, with no quick release device incorporated.

U.S. Pat. No. 2,253,432 discloses a pat clamp for use to connect a feeder off the main line. The device can be used for primary voltage, but only provides a temporary connection on a piece of copper wire molding.

U.S. Pat. No. 2,304,807 discloses a hotline jumper clamp. And again, this is for primary connections, to connect one primary to another. It illustrates a three phase junction connected with three jumpers from each phase to its respective other phase. The clamp does have a spring load, but the spring's purpose is to simply close the jaw on the device. The hotline jumper clamp does not have an automatic release, so it has to be manually installed or taken off. Further, the hotline jumper clamp is not designed to lift a load.

U.S. Pat. No. 2,453,761 discloses a hotline jumper clamp that is used essentially as an electrical connection; it is not a tool used to move or carry phases. The hotline jumper clamp does not have any strength rating, or physical strength rating, but simply an electrical rating applied to it.

U.S. Pat. No. 3,036,286 discloses an early production hotline clamp (i.e., a manually operated electrical connector). The hotline clamp must be threaded, where one has to put a hotline stick in the ring at the bottom of it, and have it turned to the right to tighten it, and to the left to loosen it. Again, the hotline clamp is not designed for any type of physical load, just electrical load, and does not incorporate a quick release.

U.S. Pat. No. 3,139,948 discloses a method and apparatus for working energized conductors. The apparatus is simply an electrical connector, not a conductor head for positioning and moving a conductor.

U.S. Pat. No. 3,177,459 discloses an electrical connector, and is simply a means of temporarily connecting two different sizes of wire together. The disclosed electrical connector is a manual, screw type, threaded-type connector.

U.S. Pat. No. 3,320,524 discloses an apparatus including an electrode means for determining electrical conditions of an aerial boom and energized line work.

U.S. Pat. No. 3,624,592 discloses a hotline for a hot stick audible connector, which is used for attachment to and detachment from a high voltage conductor. The device is a manually operated shop gun stick, not designed to carry any kind of load other than an electrical load, and no kind of physical load.

U.S. Pat. No. 4,097,108 discloses another hotline clamp. The disclosed hotline clamp is a very small device threaded with a threaded-type clamp that enables one to attach or detach it. The hotline clamp has to be manually operated, and has an electrical rating, but not a strength rating. It is not designed to hold any kind of weight, being a connector for small wire.

Lastly, U.S. Pat. No. 4,846,725 discloses a hotline clamp with the manual threads at the bottom. When placed on a conductor, one can actually latch it or make the electrical connection quickly without having to manually do it by hand. This assists in picking up some type of electrical load, simply because one does not get any blow back of any hot pieces of metal, because there is enough electrical load. It is very difficult to hold this device by hand, as the hotline clamp is intended to merely assist a serviceperson. One must manually turn the threads to release it.

Thus, the above devices are electrical connectors of various sorts, not a tool used to move conductors. Any springs on the conventional devices are for a quick connection, not for quick release, as the release mechanisms on these connectors have to be manually operated, meaning turning threads on a pole.

What is needed is a quick-release conductor head that can be triggered to release a conductor, such that a serviceperson located on the ground can activate the trigger, if necessary. It is to such a device that the present invention is primarily directed.

BRIEF SUMMARY OF THE INVENTION

Briefly described, in preferred form, the present invention is a quick-release conductor head for engaging a conductor, but capable of quickly releasing the conductor if necessary. The quick-release conductor head includes a body for receiving the conductor, a latch pivotally connected to the body, a locking system for temporarily maintaining the latch in a closed position, and an opening system for automatically moving the latch from the closed position to the open position. In the closed position, the conductor is maintained within the body of the quick-release conductor head, while in the open position the body of the quick-release conductor head can be easily disengaged from the conductor.

The locking system can comprise a locking catch adapted to temporarily maintain the latch in the closed position. The latch can include a latch release having an extended position and a retracted position, such that when the latch release is in the retracted position the latch 25 can be engaged with the locking catch, but when the latch release is in the extended position, the latch 25 disengages with the locking catch, thereby allowing the latch to move from the closed position to the open position.

The opening system can comprise a triggering mechanism and bias, such that the triggering mechanism is adapted to move the latch release from the retracted position to the extended position and the bias is adapted to automatically move the latch from the closed position to the open position, once the latch disengages with the locking catch.

The triggering mechanism can be attached to a winch that can be controlled from the ground of a utility bucket truck, thereby permitting the quick-release conductor head to be opened from the ground in the case of emergency or for other purposes. Generally, a winch connected is attached to the triggering mechanism and a winch extension, which is connected to the winch.

Further, the present invention can include a guide system having a conductor guide for guiding the conductor into the body of the quick-release conductor head and a latch release guide for guiding the latch release to the locking catch when the latch is moved to the closed position.

The quick-release conductor head can also have a jib attachment interface in communication with the body, such that the jib attachment interface is adapted to engage a jib arm positioned near the bucket of the utility bucket truck. The jib arm is used to extend and move the quick-release conductor head towards and away from the conductor during use.

These and other objects, features and advantages of the present invention will become more apparent upon reading the following specification in conjunction with the accompanying drawings.

DETAILED DESCRIPTION OF PREFERRED EMBODIMENTS

Figure 1:
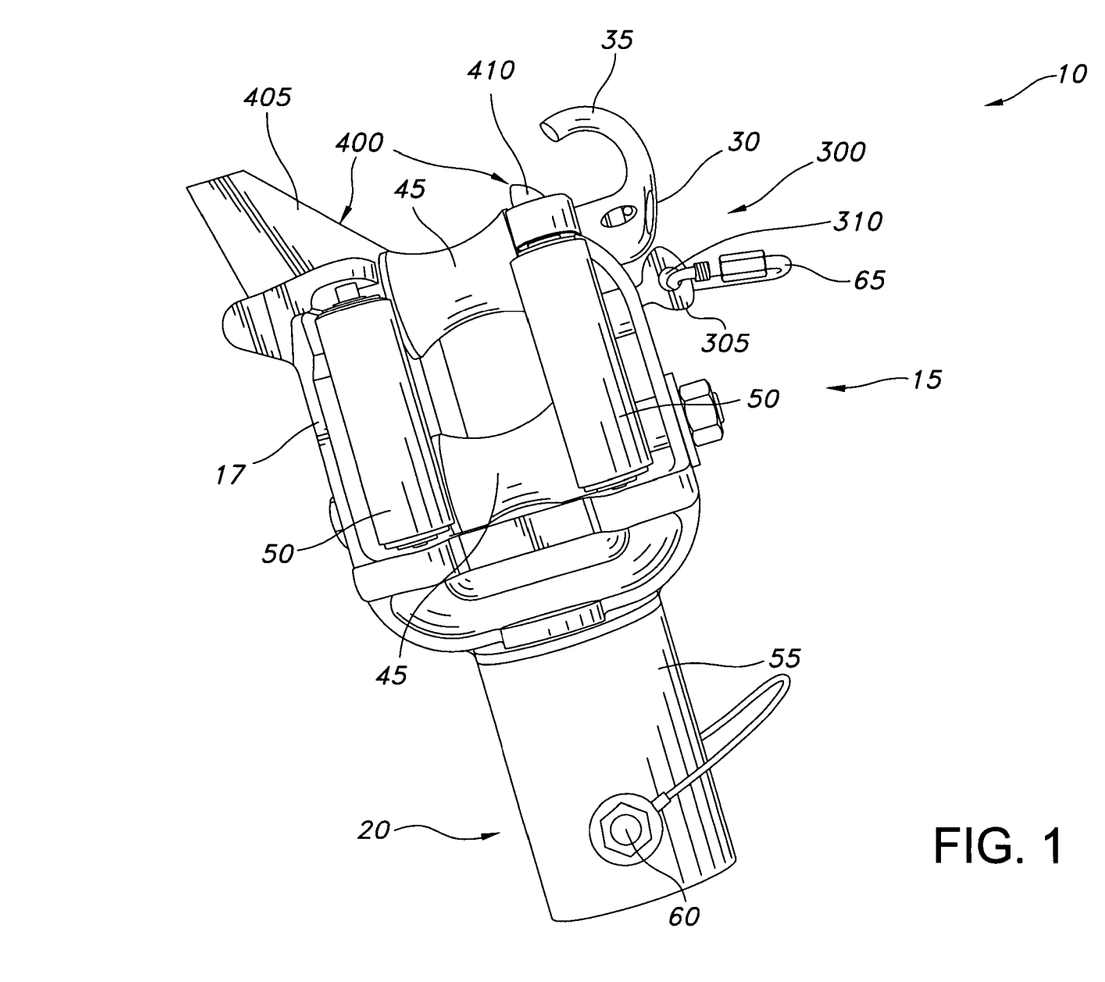
FIG. 1 illustrates a perspective view of a quick-release conductor head in a closed position in accordance with preferred embodiments of the present invention.

Referring now in detail to the drawing figures, wherein like reference numerals represent like parts throughout the several views, a quick-release conductor head 10 of FIG. 1 utilizes a U-shaped upper portion 15 and a cylindrical lower portion 20, such that the upper portion 15 can freely rotate from the lower portion 20. Generally, a heavy-duty bolt (not shown) attaches the upper portion 15 to the lower portion 20, thereby permitting the upper portion 15 to fully rotate 360 degrees. The quick-release conductor head 10 is designed for receiving a conductor, such as a power line, and moving or positioning the conductor during service of the utility. Further, the quick-release conductor head 10 is adapted to maintain the conductor within the upper portion 15 when the quick-release conductor head 10 is in the closed position, but allow the upper portion 15 to disengage from the conductor when the quick-release conductor head 10 is in the open position.

Figure 2:
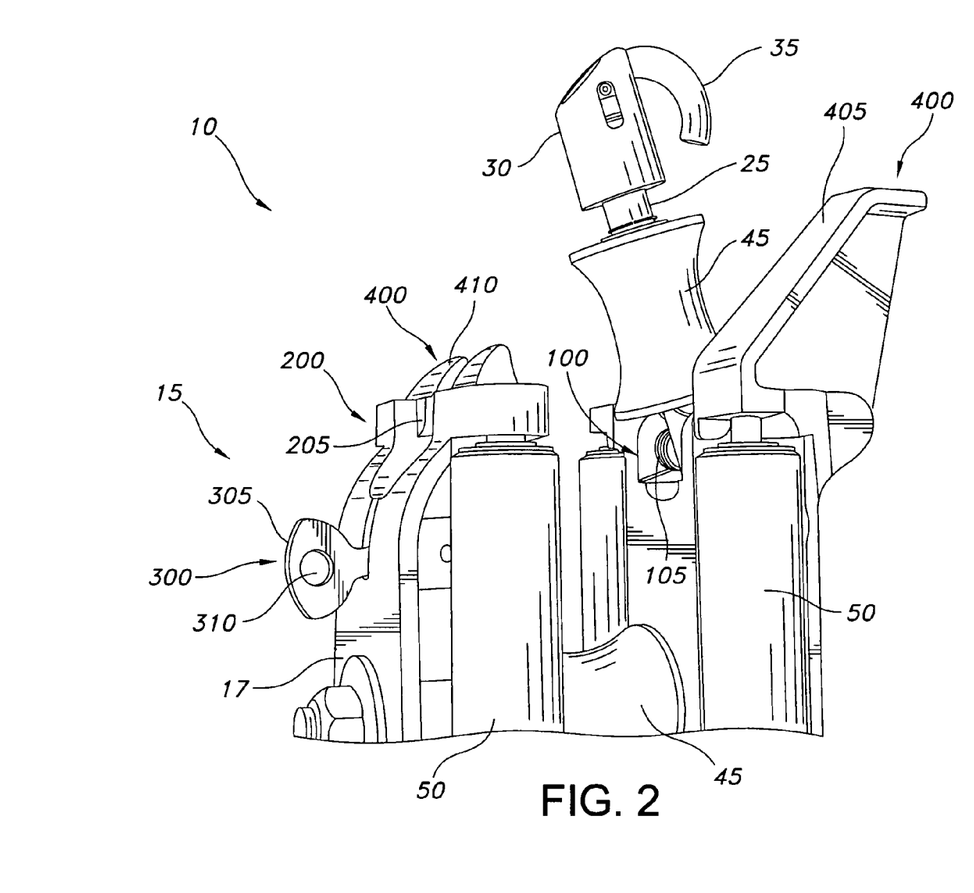
FIG. 2 illustrates a partial, perspective view of a quick-release conductor head in an open position in accordance with preferred embodiments of the present invention.

As shown in FIGS. 1 and 2, the quick-release conducting head 10 comprises a body 17, an opening system 100, and a locking system 200. The body 17 (e.g., the upper portion 15 of the quick-release conductor head 10) generally includes a U-shaped design, such that a cavity is defined within the body 17 for receiving a conductor. The opening system 100 comprises the cooperative interaction between a triggering mechanism 300 and a bias 105, and is adapted to move a latch 25 of the quick-release conductor head 10 from the closed position to the open position. The locking system 200 temporarily maintains the latch 25 of the quick-release conducting head 10 in the closed position. When activated, the triggering mechanism 300 disengages the locking system 200 and, therefore, permits the opening system 100 to move the latch 25 of the quick-release conducting head 10 from the closed position to the open position.

The triggering mechanism 300 of the opening system 100 comprises the interplay between a trigger key 305, a latch release 30 of the latch 25, and the bias 105. Typically, the triggering mechanism 300 is activated by applying a downward, triggering force to the trigger key 305. As the trigger key 305 pivots due to the applied downward, triggering force, the trigger key 305 moves the latch release 30 from a retracted position to an extended position, thereby permitting the latch 25 to disengage from the locking system 200. The bias 105 can then move the latch 25 from the closed position to the open position. One skilled in the art will recognize that the latch 25 can be disengaged manually from the locking system 200 by a serviceperson physically moving the latch release 30 from the retracted position to the extended position.

The quick-release conducting head 10 can further comprise a guide system 400 having a first and second portion, such that the first portion of the guide system 400 is adapted to guide a conductor towards the cavity of the body 17 of the quick-release conducting head 10 and the second portion of the guide system 400 is adapted to guide the latch 25 towards the locking system 200 when the latch 25 is moved from the open position to the closed position. Typically, the guide system 400 ensures that the conductor is properly received by the body 17 of the quick-release conducting head 10 and that the latch 25 properly engages the locking system 200 when in the closed position.

More specifically, the quick-release conductor head 10 comprises a body 17, a latch 25 having a latch release 30, a bias 105, a triggering mechanism 300, a locking catch 205, a conductor guide 405, a latch release guide 410, and a jib attachment interface 55. The latch 25, bias 105, triggering mechanism 300, locking catch 205, conductor guide 405, and latch release guide 410 are partially contained within the body 17. Further, the body 17 is in communication with the jib attachment interface 55, such that the body 17 can freely rotate (e.g., 360 degrees) from the jib attachment interface 55. For example and not limitation, a bolt (not shown) can connect the body 17 to the jib attachment interface 55, thereby allowing the body 17 to rotate on an axis defined by the bolt, which is positioned generally vertical between the body 17 and the jib attachment interface 55.

The jib attachment interface 55 is adapted to engage and attach the quick-release conductor head 10 to a jib arm 520 (see FIG. 5) commonly used on utility bucket trucks. In a preferred embodiment of the present invention, the jib attachment interface 55 is cylindrical in shape and is formed to define at least one pair of apertures, such that a first aperture is positioned on one side of the jib attachment interface 55 and a second aperture is positioned on an opposite side of the jib attachment interface 55. The first and second apertures are linearly aligned. For example and not limitation, the jib attachment interface 55 can be approximately 2-2½ inches in diameter and/or can be made of machined steel, rather than utilizing a cast alloy.

Figure 5:
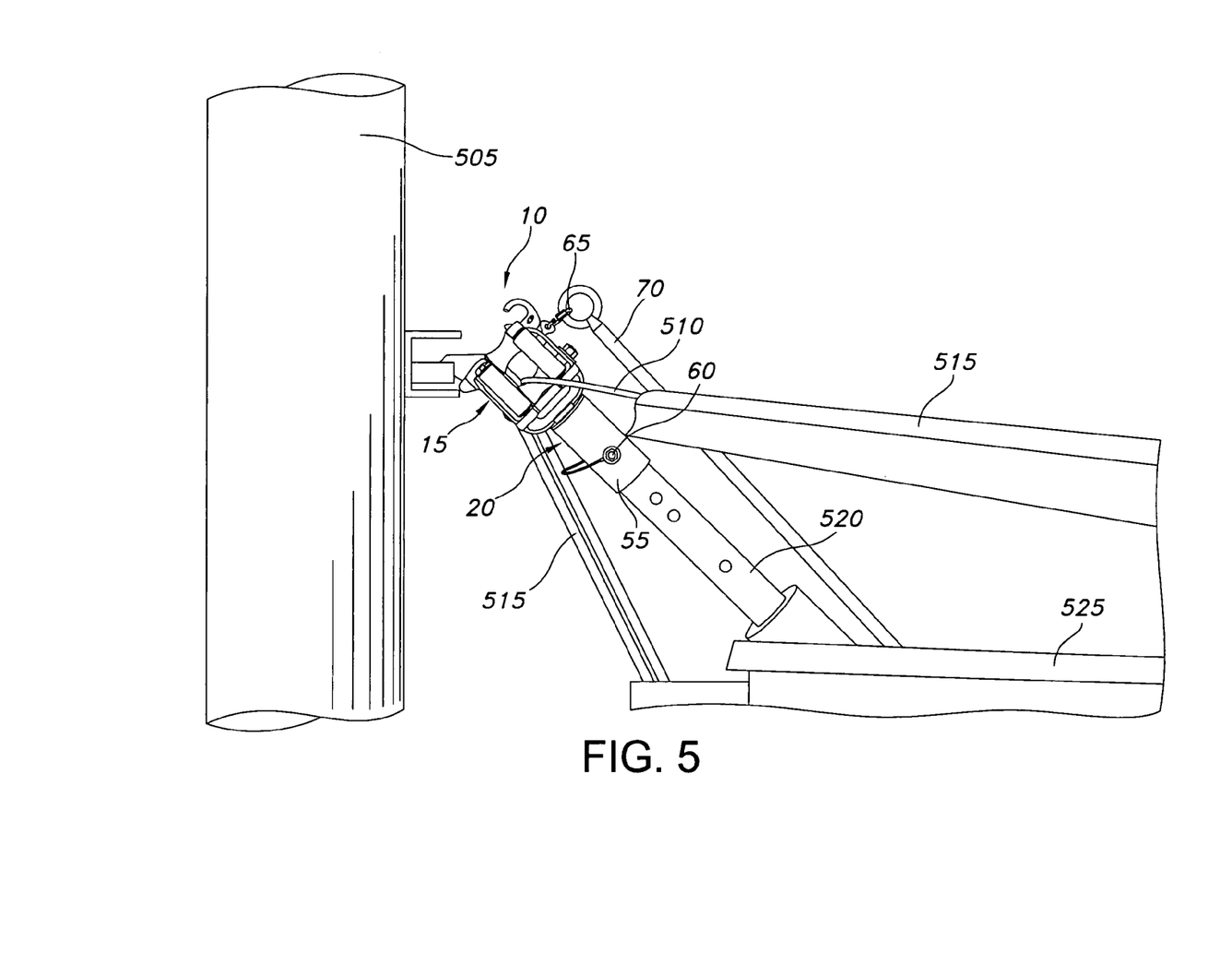
FIG. 5 illustrates a perspective view of the quick-release conductor head during use in accordance with preferred embodiments of the present invention.

The jib attachment interface 55 comprises an attachment pin 60 adapted to mount the jib attachment interface 55 onto the jib arm 520 of the utility bucket truck. Accordingly, the jib arm 520 can define at least one pair of linearly aligned apertures, such that the pair of apertures of the jib attachment interface 55 can be aligned with the pair of apertures of the jib arm 520, while the attachment pin 60 can be inserted through both pairs of apertures simultaneously, thereby securely attaching the jib attachment interface 55 to the jib arm 520 of the utility bucket truck. The jib attachment interface 55 and the attachment pin 60 are designed to withstand at least 2,000 pounds of pressure during use, thereby ensuring that the quick-release conductor head 10 has a strength rating of 2,000 pounds with a 5 to 1 safety factor.

The latch 25 generally has a first end and a second end, wherein the first end of the latch 25 is in communication with the body 17, such that the latch 25 is rotatably connected to a first prong of the U-shaped body 17. As shown more clearly in FIG. 4, a latch pin 40 is adapted to connect the latch 25 to the body 17. The latch 25 can, therefore, pivot from the first end of the latch 25 (e.g., the fulcrum) along the latch pin 40 that is connected to the body 17. The latch pin 40 securely maintains the latch 25 to the body 17 during use of the quick-release conductor head 10.

The latch release 30 is in communication with the second end of the latch 25. The latch release 30 is adapted to disengage the latch 25 from the locking system 200, when the latch release 30 is moved from the retracted position to the extended position. The latch release 30 can include a bias (not shown), such as a spring, that maintains the latch release 30 in the retracted position. After the force applied by the triggering mechanism 300 is removed from the latch release 30 (wherein the latch release 30 is moved from the retracted position to the extended position), the bias of the latch release 30 moves the latch release 30 from the extended position to the retracted position. The latch release 30 can further comprise a latch release extension 35 for providing a more accessible portion of latch release 30 when moving from the retracted position to the extended position. A serviceperson located on the ground can generally access the latch release extension 35 using a pole having a ring attached. Further, the latch release extension 35 allows the serviceperson located in the bucket to more effectively move the latch release 30 from the retracted position to the extended position, while wearing thick rubber gloves.

As described above, the body 17 is adapted to receive a conductor. As configured, the body 17 defines a cavity wherein the conductor can be received. The latch 25 can then be moved to the closed position, such that the conductor is maintained within the body 17. The body 17 can comprise a plurality of rollers 45, 50, such that the plurality of rollers 45, 50 is adapted to assist the body 17 in receiving the conductor. More particularly, the plurality of rollers 45, 50 prevent the conductor from encountering unnecessary friction, when the conductor is received, positioned, or maintained by the body 17 of the quick-release conductor head 10. At least one roller 45 is generally positioned horizontally within the body 17, and at least one roller 50 is generally positioned vertically within the body 17. Accordingly, the horizontally and vertically positioned rollers 45, 50 assist in movement of the quick-release conductor head 10 along the conductor, without causing undesired friction on the conductor.

In the closed position, the latch 25 engages a locking catch 205 adapted to temporarily maintain the latch 25 in the closed position during use of the quick-release conductor head 10. More specifically, the locking catch 205 is adapted to engage the latch release 30 of the latch 25, when the latch release 30 is in the retracted position. So long as the latch release 30 remains in the retracted position, the locking catch 205 maintains the latch 25 in the closed position, thereby preventing the body 17 from accidentally disengaging with the conductor. The locking catch 205 is generally positioned on the opposite side of the body 17 than the first end of the latch 25. Accordingly, the locking catch 205 only engages the latching release 30 when the latch 25 is in the closed position. Further, the body 17 of the quick-release conductor head 10 located beneath the locking catch 305 can be slightly slanted towards the locking catch 205, thereby assisting in the latch release 30 to engage the locking catch 205 when the latch 25 is moved to the closed position.

Figure 3:
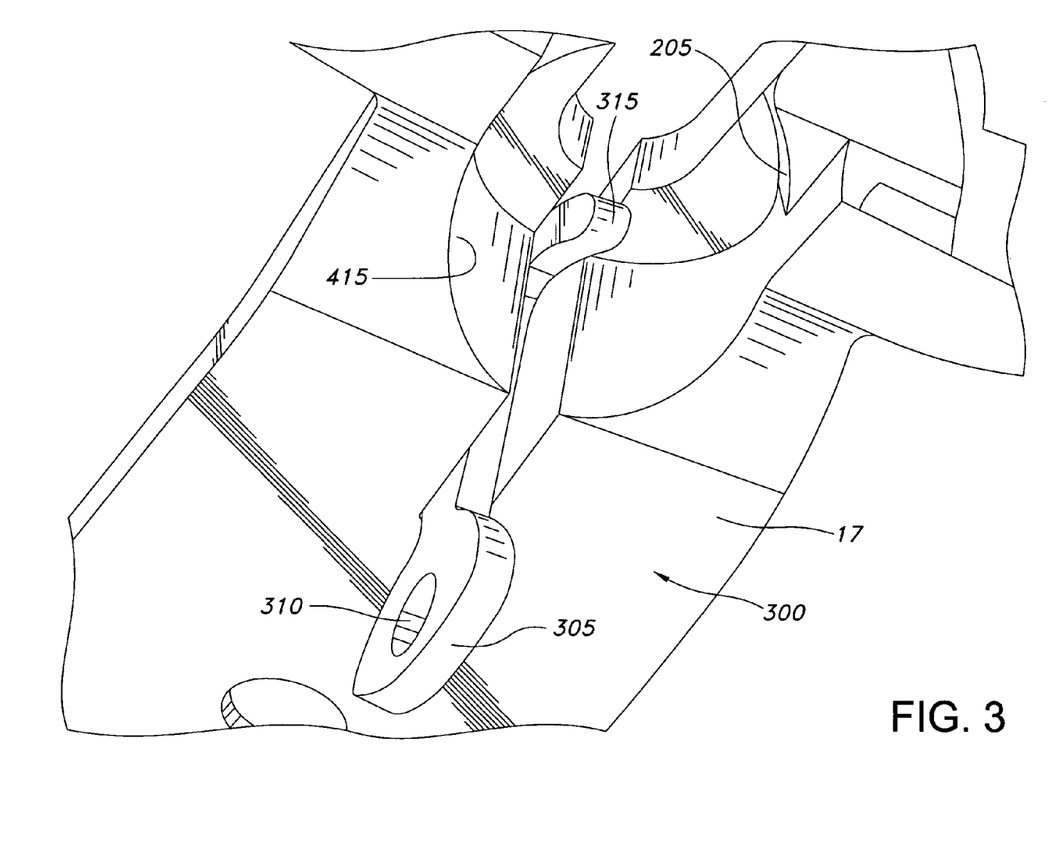
FIG. 3 illustrates a partial, perspective view of a triggering mechanism of the quick-release conductor head in accordance with preferred embodiments of the present invention.

As shown in FIG. 3, the trigger key 305 is positioned within the body 17 below the locking catch 205. The trigger key 305 is positioned within a predefined groove within the body 17, such that the trigger key 305 can pivot within the groove. The trigger key 305 includes a first end that extends outwardly from the body 17. The first end of the trigger key 305 is formed to define an aperture 310. The aperture 310 is adapted to engage a winch connector 65 (see FIGS. 1 and 5), so that a downwardly applied force can be remotely applied to the first end of the trigger key 305 from a winch located at the ground level of the utility bucket truck. The trigger key 305 pivots at a generally middle location, such that when the first end of the trigger key 305 is moved downward, a second end of the trigger key 305 moves upwardly within the groove. The second end of the trigger key 305 includes a trigger knob 315 adapted to move the latch release 30 from the retracted position to the extended position, when the latch 25 is in the closed position.

The trigger knob 315 extends outwardly from the groove when the first end of the trigger key 305 is moved downwardly. Further, when the latch 25 is moved to the closed position, the latch release 30 is adapted to apply a downward force to the second end of the trigger key 305 (e.g., the trigger knob 315), such that the first end of the trigger key 305 is then moved upward. The weight of the first end of the trigger key 305 alone cannot cause the trigger knob 315 to move the latch release 30 from the retracted position to the extended position, but a greater downward force must be applied to the first end of the trigger key 305 to cause the trigger knob 315 to move the latch release 30 from the retracted position to the extended position. As such, the bias or spring (not shown) in the latch release 30 is of sufficient strength to maintain the trigger knob 315 in a downward position (thereby maintaining the first end of the trigger key 305 in an upward position).

Figure 4:
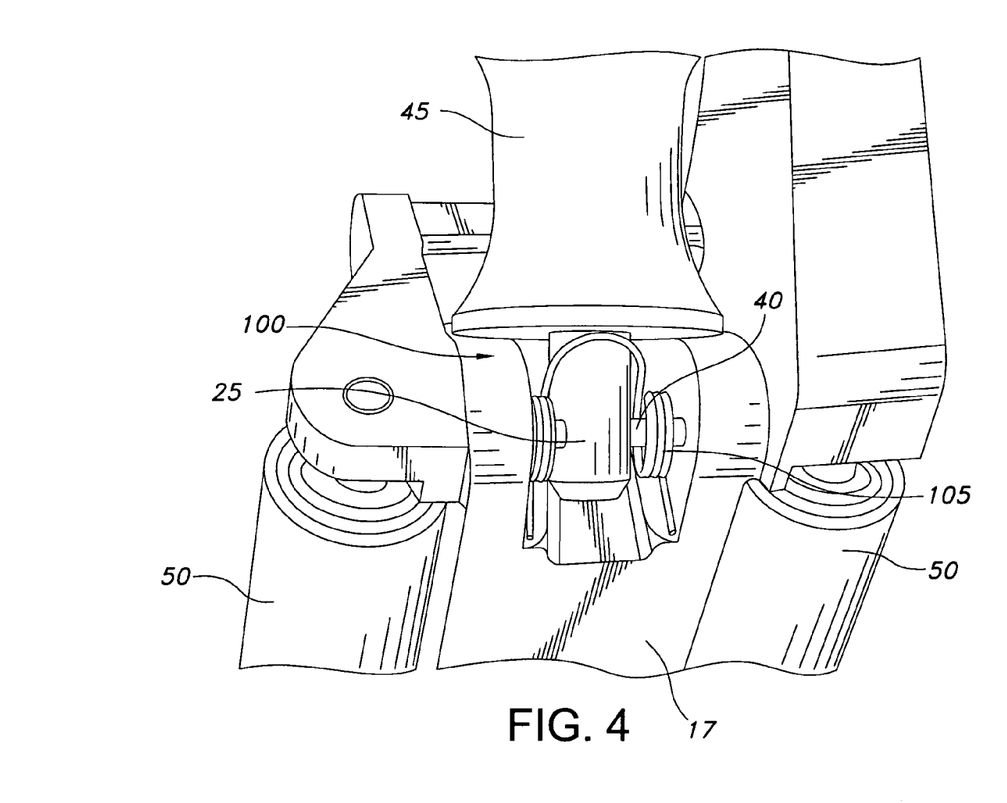
FIG. 4 illustrates a partial, perspective and sectional view of a bias system of the quick-release conductor head in accordance with preferred embodiments of the present invention.

As describe above and as illustrated in FIG. 4, the bias 105 is adapted to move the latch 25 from the closed position to the open position, when the latch release 30 disengages with the locking catch 205. Generally, the bias 105 is positioned near the first end of the latch 25, such that the bias 105 is also in communication with the latch pin 40, located near the first prong of the U-shaped body 17. When the latch 25 is in the closed position, the bias 105 is in a compressed, energized state, whereby the bias 105 is applying an upward force on the latch 25 attempting to move the latch 25 towards the open position. When the latch 25 is in the open position, the bias 105 is in an uncompressed, non-energized state, as the latch 25 is already in the open position, wherein the quick-release conductor head 10 can be successfully removed from the conductor.

As shown in FIGS. 1 and 2, the conductor guide 405 is positioned near the upper portion of the body 17, such that the conductor guide 405 is adapted to guide the conductor towards the inner cavity (or throat) defined by the body 17 of the quick-release conductor head 10, when the latch 25 is in the open position. For example, the conductor guide 405 can comprise a slanted portion of the body, such that when the conductor engages the conductor guide 405, the conductor is led inwardly towards the inner cavity of the body 17. Once the conductor has been received by the body 17, the latch 25 can be moved to the closed position, thereby maintaining the conductor within the quick-release conductor head 10 during use.

The latch release guide 410 is positioned near the locking catch 205, such that when the latch 25 is moved towards the closed position, the latch release 30 is guided towards the locking catch 205. More specifically, the latch release guide 410 is adapted to temporarily move the latch release 30 from the retracted position to the extended position when the latch 25 is moved towards the closed position. By moving the latch release 30 to the extended position, the latch release 30 can slide past the locking catch 205, before encountering a latch seat 415 positioned below the locking catch 205. The latch seat 415, as shown in FIG. 3, provides a location for the latch release 30 to rest, while in the closed position. As the latch seat 415 extends inwardly below the locking catch 205, the latch release 30 automatically moves from the extended position to the retracted position after sliding past the locking catch 205. Accordingly, the latch release 30 then engages the locking catch 205, and is temporarily maintained in the closed position until the latch release 30 is later moved to the extended position (such as by the triggering mechanism 300).

As shown in FIG. 5, the winch connector 65 connected to the trigger key 305 via the aperture 310 is also in communication with a first end of a winch extension 70. A second end of the winch extension 70 is in communication with a winch, which is mounted on the utility bucket truck. Generally, the winch (now shown), can be controlled from the bucket 525 or from the ground by another serviceperson. Accordingly, when the winch is activated, a downward force is applied to the winch extension 70, which applies a downward force to the winch connector 65, which in turn applies a downward force to the first end of the trigger key 305. Accordingly, the trigger key 305 is activated, thereby causing the trigger knob 315 to move the latch release 30 from the retracted position to the extended position. Once the latch release 30 is moved to the extended position, the latch 25 is disengaged with the locking catch 205, thereby causing the bias 105 to cause the latch 25 to move towards the open position. After the latch 25 is in the open position, the quick-release conductor head 10 can be disengaged from the conductor and, therefore, the bucket 525 can be lowered from the power line.

During use, as shown in FIG. 5, a serviceperson within a bucket 525 of the utility bucket truck is raised towards the conductor 510. Positioned next to the bucket 525 is a jib arm 520 having the quick-release conductor head 10 attached to an end via the jib attachment interface 55. With the latch 25 in the open position, the quick-release conductor head 10 is moved towards the conductor 510, where the conductor guide 405 guides the conductor towards the inner cavity of the body 17. Once the conductor 510 is received by the quick-release conductor head 10, the conductor 510 is positioned in an appropriate position to allow the serviceperson to work on the line. The plurality of rollers 45, 50 permit movement of the conductor 510 without needless friction. Once the conductor 510 is properly positioned, the serviceperson moves the latch 25 from the open position to the closed position. As the latch release 30 engages the latch release guide 410, the latch release 30 is moved from the retracted position to the extended position, thereby sliding past the locking catch 205. The latch release 30 then moves from the extended position to the retracted position, when the latch release 30 encounters the latch seat 415. Accordingly, the latch release 30 engages the locking catch 205 and is, therefore, maintained in the locked position.

During service of the conductor line 510, conductor covers 515 can be used to insulate the conductor line 510 from the serviceperson in the bucket 525. As the conductor line 510 is generally connected to a power pole 505, various types of services can be conducted while the conductor line 510 is maintained in the desired position.

After servicing the line or in case of an emergency, a downward force is applied to the trigger key 305. Such a force can be created by the serviceperson within the bucket 525 or by a winch activated by controls in the bucket 525 or on the ground. As a downward force is applied to the first end of the trigger key 305, the second end of the trigger key 305 moves upward, causing the trigger knob 315 to engage the latch release 30. The trigger knob 315 moves the latch release 30 from the retracted position to the extended position, thereby allowing the latch 25 to disengage from the locking catch 205. The bias 105, therefore, applies an upward force to the latch 25, causing the latch 25 to automatically move from the closed position to the open position. Once the latch 25 is in the open position, the quick-release conductor head 10 can be safely disengaged from the conductor 510 and the bucket 525 can be lowered towards the ground.

The present invention can be used for overhead distribution lines, among other environments, including cable laying operations off the back of a ship.

One skilled in the art will recognize that the body 17, latch 25, jib attachment interface 55, opening system 100, locking system 200, triggering mechanism 300, guide system 400, and all of the components and/or element thereof can be made of a variety of suitable materials including, but not limited to, plastic, rubber, metal, ceramic, or other suitable materials or a combination thereof.

One skilled in the art will recognize that the bias 105 can include, but is not limited to, a spring, a coil, a pressurized chamber, a flexible piece of metal, rubber, or plastic, or other appropriate device that is compressible, yet resilient. Preferably, the bias 105 is a spring, with enough resilience to effectively move the latch 25 of the quick-release conductor head 10 from the closed position to the open position.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A conductor head device comprising:
  a body for receiving a conductor;
  a latch having a first end pivotally connected to the body, such that the latch is rotatable between an open position and a closed position;
  a locking catch adapted to temporarily maintain the latch in the closed position, thereby preventing the body from disengaging with the conductor;
  a triggering mechanism adapted to disengage the latch from the locking catch;
  a bias adapted to move the latch from the closed position to the open position, wherein the body can be disengaged from the conductor in the open position; and
  a latch release positioned at a second end of the latch, wherein the latch release has a retracted position and an extended position, such that the latch engages the locking catch when the latch release is in the retracted position.

2. The conductor head device of claim 1, wherein the triggering mechanism comprises a trigger key having a knob positioned at a first end and defining an aperture at a second end, wherein the knob is adapted to move the latch release from the retracted position to the extended position when the trigger key is activated thereby causing the latch to disengage with the locking catch.

3. The conductor head device of claim 2 further comprising a winch connector in communication with the aperture of the trigger key and a remote winch, wherein the winch can remotely activate the trigger key via the winch connector.

4. The conductor head device of claim 1 further comprising:
  a conductor guide adapted to direct the conductor towards an inner cavity defined within the body; and
  a latch release guide adapted to direct the latch release towards the locking catch when the latch is moved to the closed position.

5. The conductor head device of claim 1, wherein the bias is a coil spring having an energized state when the latch is in the closed position and having a non-energized state when the latch is in the open position.

6. The conductor head device of claim 1, further comprising:
  a jib attachment device in communication with the body, wherein the jib attachment device defines a first set of apertures; and
  an attachment pin adapted to connect the jib attachment device to a jib arm defining a second set of apertures, wherein the attachment pin is received within the aligned first and second set of apertures.

7. The conductor head device of claim 6, wherein the jib attachment device has a strength rating of at least 2,000 pounds.

8. The conductor head device of claim 1, wherein the body comprises a plurality of rollers adapted to reduce friction between the body and the conductor, wherein at least one first roller is positioned substantially vertical within the body and at least one second roller is positioned substantially horizontal within the body.

9. A quick-release conductor head comprising:
a U-shaped body for receiving a conductor;
a latch having a first end pivotally connected to the body, such that the latch is rotatable between an open position and a closed position;
a latch release positioned at a second end of the latch, wherein the latch release has a retracted position and an extended position;
a locking catch adapted to temporarily engage the latch release when the latch is in the closed position and the latch release is in the retracted position, thereby preventing the body from disengaging with the conductor;
a triggering mechanism adapted to move the latch release from the retracted position to the extended position, wherein the latch release is disengaged from the locking catch; and
a bias adapted to move the latch from the closed position to the open position, wherein the body can be disengaged from the conductor in the open position.

10. The quick-release conductor head of claim 9, wherein the triggering mechanism comprises a trigger key having a knob positioned at a first end and defining an aperture at a second end, wherein the knob is adapted to move the latch release from the retracted position to the extended position when the trigger key is activated.

11. The quick-release conductor head of claim 9 further comprising a winch connector in communication with the aperture of the trigger key and a remote winch, wherein the winch can remotely activate the trigger key via the winch connector.

12. A quick-release conductor head comprising:
a body adapted to receive a conductor;
a latch having a first end pivotally connected to the body, the latch being rotatable between an open position and a closed position;
a latch release positioned at a second end of the latch, wherein the latch release has a retracted position and an extended position; and
a locking catch adapted to temporarily engage the latch release when the latch is in the closed position and the latch release is in the retracted position, thereby preventing the body from disengaging with the conductor.

13. The quick-release conductor of claim 12, further comprising an opening system comprising:
a triggering mechanism adapted to move the latch release from the retracted position to the extended position, wherein the latch release is disengaged from the locking catch; and
a bias adapted to move the latch from the closed position to the open position.

14. The quick-release conductor of claim 13, wherein the triggering mechanism comprises a trigger key having a knob positioned at a first end and defining an aperture at a second end, wherein the knob is adapted to move the latch release from the retracted position to the extended position when the trigger key is activated thereby causing the latch to disengage with the locking catch.

15. The quick-release conductor head of claim 14, further comprising a winch connector in communication with the aperture of the trigger key and a remote winch, wherein the winch can remotely activate the trigger key via the winch connector.

16. The quick-release conductor head of claim 12, further comprising:
a conductor guide adapted to direct the conductor towards an inner cavity defined within the body; and
a latch release guide adapted to direct the latch release towards the locking catch when the latch is moved to the closed position.

* * * * *